(12) United States Patent
Sluzewski et al.

(10) Patent No.: US 6,985,332 B1
(45) Date of Patent: Jan. 10, 2006

(54) HEAD GIMBAL ASSEMBLY WITH FLEX CIRCUIT ARRANGEMENT BETWEEN SLIDER AND HEAD INTERCONNECT ASSEMBLY

(75) Inventors: David Allen Sluzewski, Edina, MN (US); David Gordon Qualey, Apple Valley, MN (US); Kevin Jon Schulz, Apple Valley, MN (US); Gordon Merle Jones, Eagan, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/455,851

(22) Filed: Dec. 7, 1999

Related U.S. Application Data

(60) Provisional application No. 60/111,307, filed on Dec. 7, 1998.

(51) Int. Cl.
*G11B 5/60* (2006.01)
*G11B 21/21* (2006.01)

(52) U.S. Cl. ................................ 360/234.5; 360/234.6
(58) Field of Classification Search ... 360/234.5–234.6
See application file for complete search history.

(56) References Cited

U.S. PATENT DOCUMENTS

| 4,789,914 A | | 12/1988 | Ainslie et al. | |
| 5,396,390 A | * | 3/1995 | Arakawa et al. | 360/234.5 |
| 5,610,783 A | | 3/1997 | Maffitt et al. | |
| 5,768,062 A | * | 6/1998 | Anderson et al. | |
| 5,771,138 A | * | 6/1998 | Zarouri et al. | 360/234.5 |
| 5,815,347 A | * | 9/1998 | Pattanaik | |
| 5,896,248 A | * | 4/1999 | Hanrahan et al. | 360/234.5 |

FOREIGN PATENT DOCUMENTS

| JP | 62-014310 | * 1/1987 |
| JP | 01-312720 | * 12/1989 |
| JP | 04-092210 | * 3/1992 |

* cited by examiner

*Primary Examiner*—Craig A. Renner

(57) ABSTRACT

A slider scale package assembly in a head gimbal assembly (HGA) for electrically coupling a slider/magnetic recording (MR) head to a head interconnect circuit in a disc drive includes a flex circuit attached to the back of the slider/MR head which turns the slider/MR head into the slider scale package with at least one repositioned interconnect pad disposed at the back of the slider/MR head. The flex circuit further includes a conductive material, one end of which is electrically bonded to a bond pad of the slider/MR head, and the other end is electrically bonded to a conductive material of the head interconnect circuit via the interconnect pad. A plurality of flex circuits can be made in a sheet format and dividable into a plurality of individual flex circuits to be attached to a plurality of slider/MR heads. The bonding of the conductive material of the flex circuit to the slider/MR head and the bonding of the interconnect pad of the flex circuit to the conductive material of the head interconnect circuit can be done in a separate automated process.

12 Claims, 6 Drawing Sheets

HEAD GIMBAL ASSEMBLY WITH FLEX CIRCUIT ARRANGEMENT BETWEEN SLIDER AND HEAD INTERCONNECT ASSEMBLY

RELATED APPLICATIONS

This application claims the benefit of Provisional Application, U.S. Ser. No. 60/111,307, filed on Dec. 7, 1998, entitled to "SLIDER SCALE PACKAGE FOR MAGNETIC RECORDING HEADS", by David A. Sluzewski, David G. Qualey, Kevin J. Schulz, and Gordon M. Jones.

FIELD OF THE INVENTION

The invention relates generally to magnetic disc drives and head gimbal assemblies, more particularly, to magnetic disc drives and head gimbal assemblies having a slider scale package for magnetic recording heads.

BACKGROUND OF THE INVENTION

Modern computers require media in which digital data can be quickly stored and retrieved. Magnetizable (hard) layers on discs have proven to be a reliable media for fast and accurate data storage and retrieval. Disc drives that read data from and write data to hard discs have thus become popular components of computer systems. To access memory locations on a disc, a read/write head (also referred to as a "slider") is positioned slightly above the surface of the disc while the disc rotates beneath the read/write head at an essentially constant velocity. By moving the read/write head radially over the rotating disc, all memory locations on the disc can be accessed. The read/write head is typically referred to as "flying" head because it includes a slider aerodynamically configured to hover above the surface on an air bearing located between the disc and the slider that is formed as the disc rotates at high speeds. The air bearing supports the read/write head above the disc surface at a height referred to as the "flying height."

In conventional disc drives, one or more hard discs are coupled to and rotate about a spindle, each disc presenting two opposite substantially flat surfaces for reading and recording. Typically, multiple rotating hard discs are stacked in a parallel relationship with minimal spacing between adjacent discs. Accordingly, the read/write heads must be designed to move within the narrow space between adjacent discs and fly close to the disc surfaces. To achieve this positional capability, the read/write heads in typical disc drives are coupled to the distal end of thin, arm-like structures called head gimbal assemblies, or HGAs. The HGAs are inserted within the narrow space between adjacent discs. The HGAs are made of materials and thicknesses as to be somewhat flexible and allow a measure of vertical positioning as the read/write heads hover over the surface of the rotating discs.

Each HGA is coupled at its proximal end to a rigid actuator arm. The actuator arm horizontally positions the HGA and read/write head over the disc surface. In conventional disc drives, actuator arms are stacked, forming a multi-arm head stack assembly. The head stack assembly moves as a unit under the influence of a voice coil motor to simultaneously position all head gimbal assemblies and corresponding read/write heads over the disc surfaces.

The HGA in a typical disc drive includes four components: 1) a magnetic recording (MR) head or slider, features a self-acting hydrodynamic air bearing and an electromagnetic transducer for reading and writing data on a spinning magnetic disc; 2) a gimbal, which is attached to the slider, is compliant in the slider's pitch and roll axes for the slider to follow the topography of the disc, and is rigid in yaw and in-plane axes for maintaining precise slider positioning; 3) a load beam or flexure, which is attached to the gimbal and to the actuator arm which attaches the entire HGA to the actuator. The load beam is compliant in a vertical axis to allow the slider to follow the topography of a disc, and is rigid in the in-plane axes for precise slider positioning. The load beam also supplies a downward force that counteracts the hydrodynamic lifting force developed by the slider's air bearing; and 4) a head interconnect circuit, which is disposed on the load beam and electrically coupled to the transducer of the slider. The head interconnect circuit sends the electric signals to and from the transducer of the slider/MR head. In one embodiment, the gimbal is assembled separately from the head interconnect circuit. In another embodiment, the gimbal is assembled together with the head interconnect circuit.

As the volume of HGAs in a disc drive increases from year to year, and the size of the components of the HGAs continue to shrink, the amount of labor and cost in manufacturing the HGAs becomes a large percentage of the total manufacturing cost. To decrease labor and cost, many disc drive manufacturers have implemented automation in an HGA assembling process. Circuitized or "wireless" designs for a head interconnect circuit of an HGA have been used to replace an individual or twisted pair wire designs for a head interconnect circuit. Further, to connect electrical bond pads of a slider/MR head to electrical bond pads of a head interconnect circuit in an automatic HGA line, several manufacturers have used a corner ball bonding technique between the bond pads of the slider/MR head and the bond pads of the head interconnect circuit. FIG. 2 illustrates a typical corner ball bonding assembly for electrically connecting a slider/MR head to a head interconnect circuit. Such bonding process often uses an ultrasonic bonding.

The problem associated with a corner ball bonding assembly is that it requires a three-dimensional interconnection between the bond pads of a slider/MR head and the bond pads of a head interconnect circuit. The three-dimensional interconnection requires that the slider/MR head, a conductive ball, and the head interconnect circuit be available at the same time in such a small three-dimension while the slider/MR head is being bonded to the head interconnect circuit. The three-dimensional interconnection corner ball bonding technique drives expensive tooling and rigid fixturing of the slider/MR head. Accordingly, the cost of manufacturing an HGA is still very high.

It is with respect to these and other considerations that the present invention has been made.

SUMMARY OF THE INVENTION

In accordance with this invention, the above and other problems were solved by providing a flex circuit attached to the back of a slider/MR head which turns the slider/MR head into a slider scale package with repositioned interconnect pads.

In one embodiment of the present invention, the flex circuit includes a conductive material, and at least one interconnect pad being electrically connected to the conductive material of the flex circuit. The interconnect pad is disposed at the back of a slider/MR head. The conductive material of the flex circuit is electrically bonded to at least one bond pad of the slider/MR head.

Still in one embodiment of the present invention, the electrical bonding between the conductive material of the flex circuit and the bond pad of the slider/MR head is disposed at a front end of the slider/MR head. Alternatively, the electrical bonding between the conductive material of the flex circuit and the at least one bond pad of the slider/MR head is disposed at the back of the slider/MR head. The electrical bonding between the conductive material of the flex circuit and the at least one bond pad of the slider/MR head is disposed at the back of the slider/MR head via a bonding ball. Alternatively, the electrical bonding between the conductive material of the flex circuit and the at least one bond pad of the slider/MR head is disposed at a front end of the slider/MR head via a bonding ball.

Further in one embodiment of the present invention, the slider scale package includes a head interconnect circuit which includes a conductive material. The conductive material of the head interconnect circuit is electrically bonded to the interconnect pad of the flex circuit.

Additionally in one embodiment of the present invention, the flex circuit includes first, second, third, and fourth interconnect pads, and the slider/MR head includes first, second, third, and fourth bond pads.

Yet in one embodiment of the present invention, the first and second bond pads are electrically coupled to a first pair of positive and negative polarities of the slider/MR head for reading data, respectively. The third and fourth bond pads are electrically coupled to a second pair of positive and negative polarities of the slider/MR head for writing data, respectively.

Still in one embodiment of the present invention, the first, second, third, and fourth interconnect pads are arranged such that the polarities of the bond pads of the slider/MR head match with polarities from the head interconnect circuit. In one embodiment, the first and second interconnect pads are electrically connected to the first and second bond pads of the slider/MR head, respectively, and the third and fourth interconnect pads are electrically connected to the third and fourth bond pads of the slider/MR head, respectively. Alternatively, the first and second interconnect pads are electrically connected to the second and first bond pads of the slider/MR head, respectively, and the third and fourth interconnect pads are electrically connected to the fourth and third bond pads of the slider/MR head, respectively.

Further in one embodiment of the present invention, a plurality of flex circuits are made in a sheet format and are dividable into a plurality of individual flex circuits.

Yet in one embodiment of the present invention, the bonding of the conductive material of the flex circuit to the slider/MR head and the bonding of the interconnect pad of the flex circuit to the conductive material of the head interconnect circuit can be done in a separate automated process.

In one embodiment of the present invention, a head gimbal assembly (HGA) for supporting a slider/MR head in a disc drive includes a suspension supporting the slider/MR head; a head interconnect circuit being attached to and disposed along the suspension, the head interconnect circuit including a conductive material; and a slider scale package for electrically coupling the slider/MR head to the head interconnect circuit, wherein the slider scale package comprises a flex circuit attached to the back of the slider/MR head which turns the slider/MR head into the slider scale package with at least one interconnect pad disposed at the back of the slider/MR head. The interconnect pad of the flex circuit is electrically bonded to the conductive material of the head interconnect circuit.

Still in one embodiment of the present invention, the flex circuit further includes a conductive material, and the slider/MR head includes at least one bond pad. The conductive material of the flex circuit is electrically connected to the at least one interconnect pad at a first end and to the bond pad of the slider/MR head at a second end.

Further in one embodiment of the present invention, the flex circuit includes first, second, third, and fourth interconnect pads, and the slider/MR head includes first, second, third, and fourth interconnect pads. The interconnect pads are arranged such that polarities of the bond pads of the head interconnect circuit match with polarities from the head interconnect circuit.

Additionally in one embodiment of the present invention, a plurality of flex circuits are made in a sheet format and are dividable into a plurality of individual flex circuits.

Yet in one embodiment of the present invention, the bonding of the conductive material of the flex circuit to the slider/MR head and the bonding of the interconnect pad of the flex circuit to the conductive material of the head interconnect circuit can be done in a separate automated process.

One of the advantages of the present invention is that a slider scale package of a slider/MR head and a flex circuit can be placed onto a head interconnect circuit by a simple pick and place automated process. The interconnect pads of the slider scale package can be readily bonded to the head interconnect circuit in an automated process. In one embodiment, the bonding between the interconnect pads and the conductive material of the head interconnect circuit can be done by a variety of methods, such as solder, conductive adhesive, thermo-compression, etc.

One of the other advantages of the present invention is that a slider scale package can be readily attached/detached/reattached to a head interconnect circuit by soldering, thermo-compressing, or any other suitable bonding methods.

These and various other features as well as advantages which characterize the present invention will be apparent from a reading of the following detailed description and a review of the associated drawings.

DETAILED DESCRIPTION OF THE PREFERRED EMBODIMENT

In the following description of the present invention, reference is made to the accompanying drawings which form a part hereof, and in which is shown by way of illustration specific embodiments in which the invention may be practiced. It is understood that other embodiments may be utilized and structural changes may be made without departing from the scope of the present invention.

Figure 1:
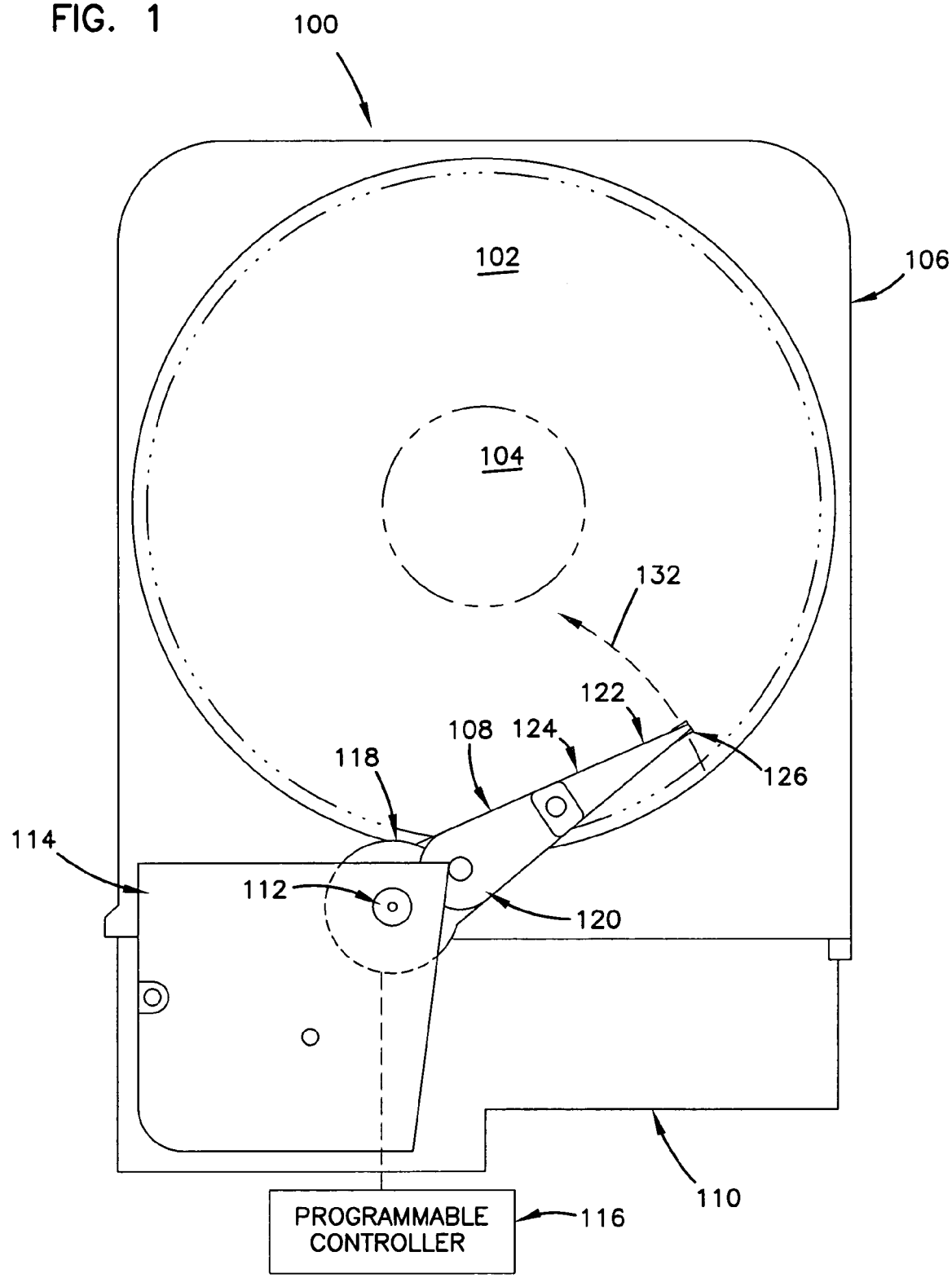
FIG. 1 illustrates a top view of one embodiment of a disc drive having a circuitized head gimbal assembly (HGA) in accordance with the principles of the present invention.

FIG. 1 illustrates a top view of one embodiment of a disc drive 100. The disc drive 100 includes a magnetic disc 102 mounted for rotational movement about an axis defined by a spindle 104 within a housing 106. The disc drive 100 also includes a stacked actuator system alternatively referred to as a head stack assembly 108 mounted to a base plate 110 of the housing 106 and pivotally movable relative to the disc 102 about an axis 112. A cover 114 covers a portion of the head stack assembly 108. A drive controller 116 is coupled to the head stack assembly 108. As shown, the drive controller 116 is disposed outside the disc drive 100. It is appreciated that the drive controller 116 can be mounted within the disc drive 100 with a suitable connection to the head stack assembly 108. It is noted that one disc 102 is illustrated in FIG. 1. It is appreciated that a stack of discs are disposed underneath the one disc 102 and mounted for rotational movement about the axis defined by the spindle 104.

The head stack assembly 108 includes an actuator arm assembly 118, an actuator arm 120, and a head gimbal assembly (HGA) 122. The HGA 122 includes a load beam or flexure 124 mounted on the actuator arm 120, and a slider/MR head 126 mounted on the load beam 124. The slider/MR head 126 can be mounted on the load beam via a gimbal (not shown). The gimbal and the load beam are often referred to as a suspension of the slider/MR head (hereinafter referred to suspension 124). A transducer 128 (shown in FIG. 3) is generally disposed at the front end of the slider/MR head 126 for reading data from the disc 102 and writing data onto the disc 102.

A head interconnect circuit 130 (FIGS. 2, 3, 7, 10, 11) is electrically connected to the drive controller 116 at one end and electrically connected to the transducer of the slider/MR head 126 at the other end. Read/write data are thus transferred between the transducer and the drive controller 116 via the head interconnect circuit 130. Also, as shown, the head interconnect circuit 130 is disposed along and mounted on the suspension 124, preferably by an adhesive material, such as glue.

During operation, the drive controller 116 receives position information indicating a portion of the disc 102 to be accessed. The drive controller 116 may receive the position information from the operator, from a host computer, or from another suitable controller. Based on the position information, the drive controller 116 provides a position signal to the head stack assembly 108. The position signal causes the head stack assembly 108 to pivot or rotate about the axis 112. This, in turn, causes the slider/MR head 126 to move radially over the surface of the disc 102 in a generally arcuate path as indicated by arrow 132 shown in FIG. 1. Once the slider/MR head 126 is properly positioned, the drive controller 116 then executes a desired read or write operation. After the operation, the drive controller 116 then moves the head stack assembly 108 to an area, e.g. a parking area, etc. It is appreciated that different implementations can be used for the head stack assembly 108 during its non-use period. For example, the head stack assembly 108 can be moved to its original position prior to its movement to the operational position, or can be placed at the same position as the operational position.

Figure 2:
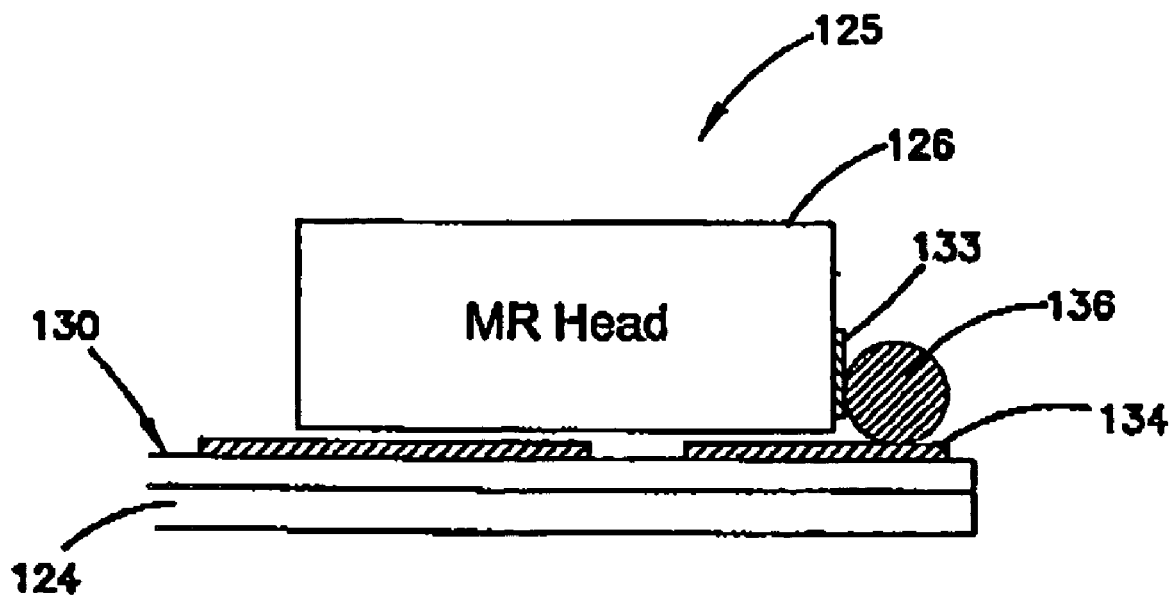
FIG. 2 illustrates a cross-sectional view of a typical corner ball bonding assembly for electrically connecting a slider/MR head to a head interconnect circuit in an HGA.

FIG. 2 illustrates a cross-sectional view of a typical corner ball bonding assembly 125 for electrically connecting the slider/MR head 126 to the head interconnect circuit 130. The slider/MR head 126 includes one or more bond pad 133, typically four bond pads, one pair being for reading, and the other pair being for writing. One bond pad in each pair is electrically coupled to a positive polarity of the transducer, and the other bond pad in each pair is electrically coupled to a negative polarity of the transducer.

Also in FIG. 2, the head interconnect circuit 130 includes a conductive material 134, preferably copper, which is electrically connected to the drive controller 116. A corner bonding ball 136 is electrically bonded between the bond pad 133 of the slider/MR head 126 and the conductive material 134. As mentioned above, the problem with a typical corner ball bonding is that it requires a three-dimensional interconnection between the bond pad 133 and the conductive material 134 of the head interconnect circuit 130 on the suspension 124. The three-dimensional interconnection requires that the slider/MR head 126, the corner bonding ball 136, and the circuit 130/suspension 124 be available at the same time in such a small three-dimension while the slider/MR head 126 is being bonded to the circuit 130/suspension 124. The three-dimensional interconnection corner ball bonding assembly as shown in FIG. 2 drives expensive tooling and rigid fixturing of the slider/MR head 126, particularly in an ultrasonic bonding.

Figure 3:
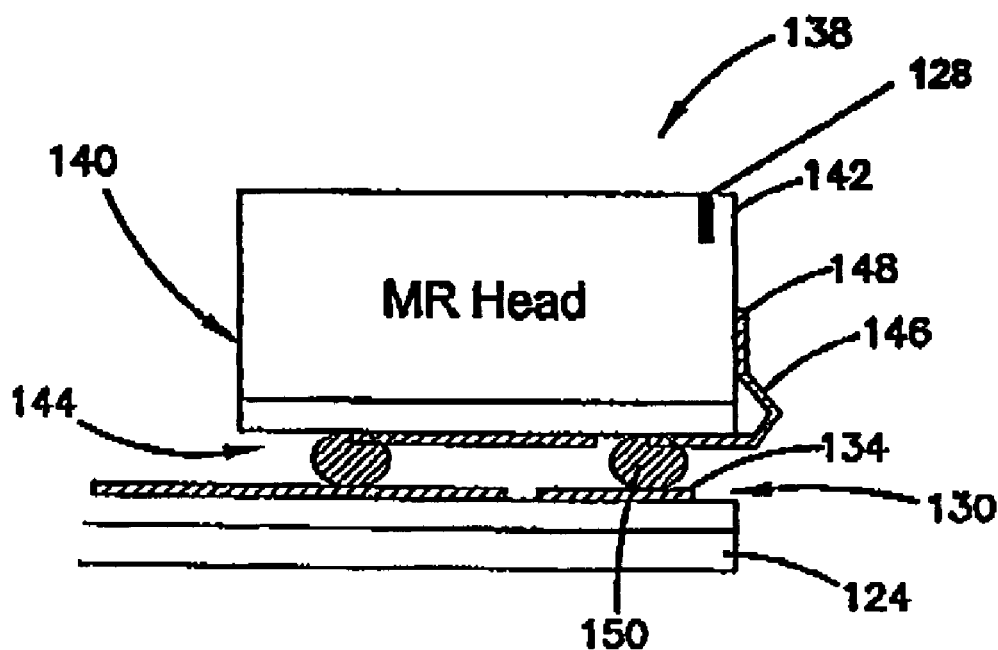
FIG. 3 illustrates a cross-sectional view of a first embodiment of a bonding assembly having a slider scale package of a slider/MR head and a flex circuit for electrically connecting the slider/MR head to a head interconnect circuit in an HGA in accordance with the principles of the present invention.

FIG. 3 illustrates a cross-sectional view of one embodiment of a bonding assembly 138 in accordance with the principles of the present invention. The bonding assembly 138 includes a slider scale package 140 of a slider/MR head 142 and a flex circuit 144, and the head interconnect circuit 130 mounted on the suspension 124. The head interconnect circuit 130 includes a conductive material 134, preferably copper, which is electrically connected to the drive controller 116.

In FIG. 3, the flex circuit 144 includes a conductive material 146, preferably copper. One end of the conductive material 146 is bent upwardly and electrically connected and bonded to a bond pad 148 of the slider/MR head 142. The bonding can be done by a variety of ways, such as solder, conductive adhesive, etc. The flex circuit 144 also includes an interconnect pad 150 disposed at the other end of the conductive material 146. "As shown, the interconnect pad 150 is positioned at the back or top of the slider/MR head 142 (the slider surface facing the suspension) and is electrically bonded to the conductive" material 134 of the head interconnect circuit 130. The bonding of the interconnect pad 150 to the conductive material 134 of the circuit 130 can be done by a variety of ways, such as solder, conductive adhesive, thermo-compression gold to gold, conductive polymers, etc.

Figure 6:
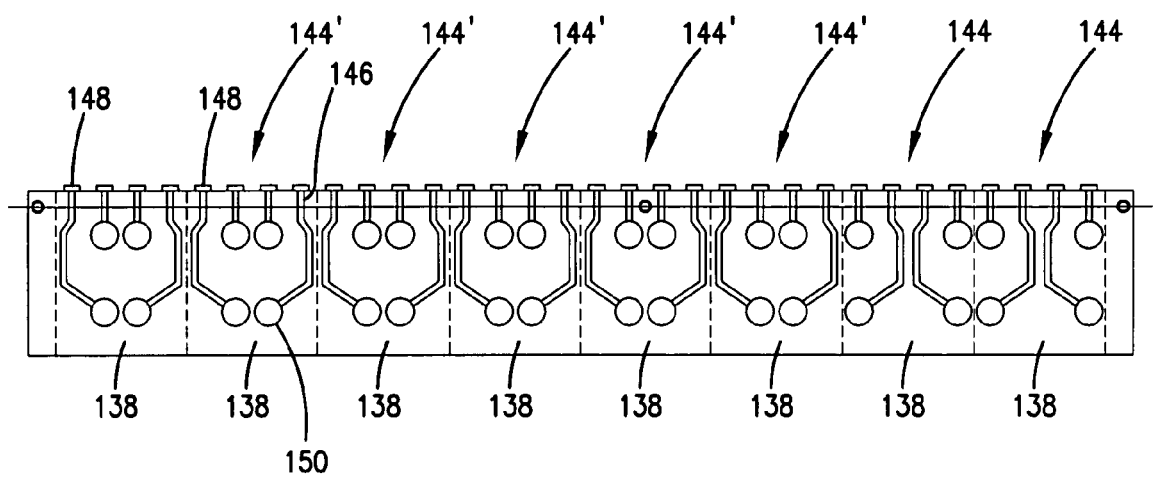
FIG. 6 illustrates one embodiment of a plurality of flex circuits in a bar or sheet format disposed at the back of a plurality of slider/MR heads in accordance with the principles of the present invention.

Accordingly, the bonding of the flex circuit 144 to the slider/MR head 138 can be assembled separately from the bonding of the interconnect pad 150 to the conductive material 134. Accordingly, a plurality of flex circuits 144 can be made in a bar or sheet format as shown in FIG. 6. The plurality of flex circuits 144 are electrically coupled to a plurality of slider/MR heads 142 in a plurality of slider scale packages 140. The plurality of slider scale packages 140 can be divided into individual slider scale packages. The slider scale packages are easy to implement into high volume surface mount or flip chip automated processing lines. These automated processing lines can be "off the shelf" and require little or no tooling for attaching the slider scale packages to HGAs. Thus, these automated processing lines drastically reduce labor and cost in assembling an HGA.

Figure 4:
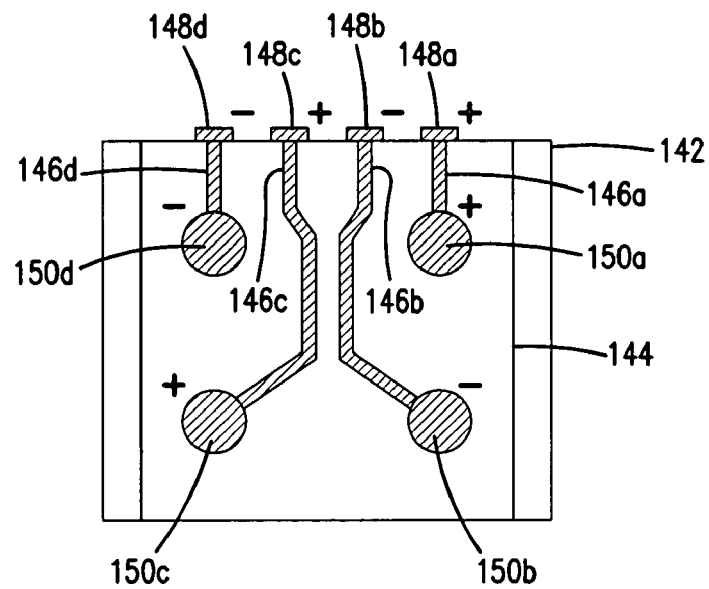
FIG. 4 illustrates one embodiment of interconnect pads disposed at the back of the slider scale package of the slider/MR head and the flex circuit of the first embodiment of the bonding assembly in accordance with the principles of the present invention.
Figure 5:
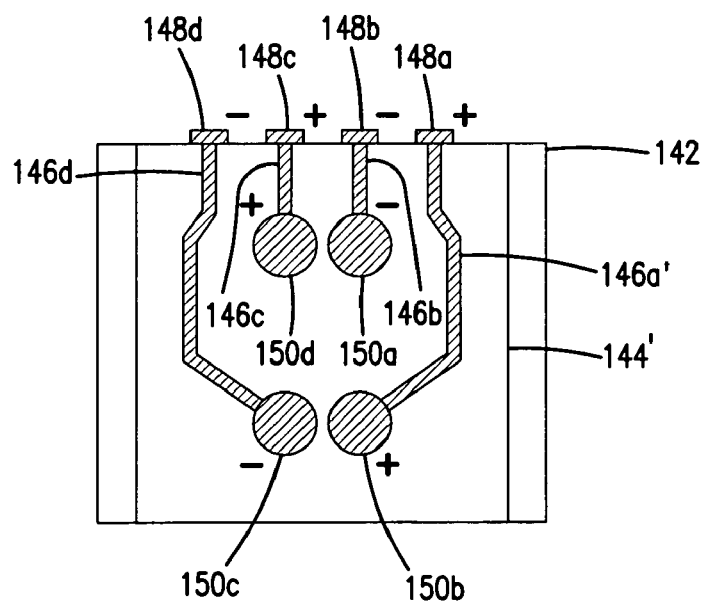
FIG. 5 illustrates an alternative embodiment of interconnect pads disposed at the back of the slider scale package of the slider/MR head and the flex circuit of the first embodiment of the bonding assembly in accordance with the principles of the present invention.

FIGS. 4–5 illustrate two different embodiments of interconnect pads 150 which are disposed at the back of the slider scale package 140 of the slider/MR head 142 and the flex circuit 144 in accordance with the principles of the present invention. In FIG. 4, interconnect pads 150a, 150b, 150c, 150d are connected to bond pads 148a, 148b, 148c, 148d via conductive materials 146a, 146b, 146c, 146d, respectively. In one embodiment, the bond pads 148a, 148b are coupled to a first pair of positive and negative polarities, respectively, of the slider/MR head 142 for reading data. The bond pads 148c, 148d are coupled to a second pair of positive and negative polarities, respectively, of the slider/MR head 142 for writing data. The polarities from the head interconnect circuit 130 match with the polarities of the bond pads 148a–d.

When the polarities of the head interconnect circuit 130 are reversed as shown in FIG. 5, a different embodiment of a flex circuit 144' can be used. As shown in FIG. 5, interconnect pads 150a, 150b, 150c, 150d are connected to bond pads 148b, 148a, 148d, 148c via conductive materials 146a' 146b', 146c', 146d', respectively. As shown, the polarities from the head interconnect circuit 130 still match with the polarities of the bond pads 148a, 148b, 148c, 148d. Thus, a circuit routing of the head interconnect circuit 130 does not need to be redesigned or changed when the polarities of the head interconnect circuit are reversed. Further, the arrangement of the bond pads 148a–d does not need to be modified when the polarities of the head interconnect circuit are reversed. This allows to standardize a bond pad configuration at the head level.

FIG. 6 also illustrates one embodiment of a plurality of slider scale packages having a plurality of flex circuits 144 and a plurality of alternative flex circuits 144' in a bar or sheet format. As mentioned above, the slider scale packages can be divided into individual slider scale packages to be used in a plurality of head interconnect circuits. It is appreciated that different arrangements of the flex circuits 144, 144' in the bar or sheet format can be used without departing the principles of the present invention.

Figure 7:
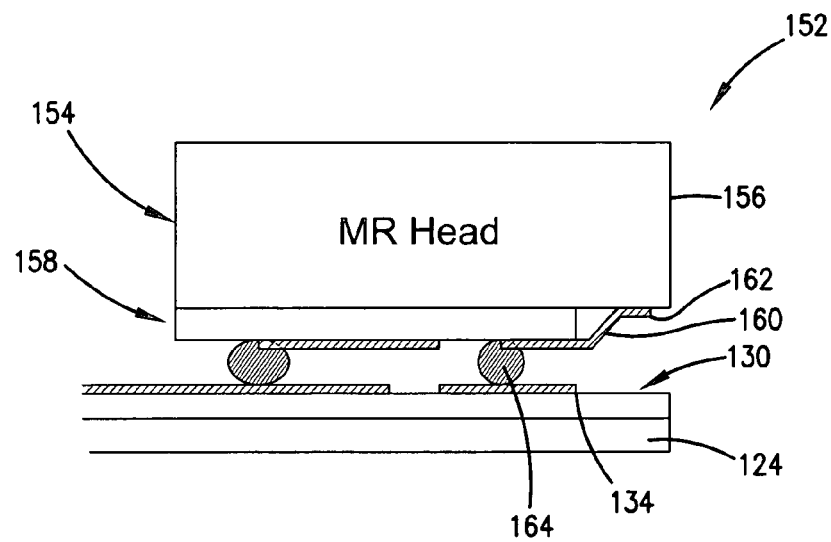
FIG. 7 illustrates a cross-sectional view of a second embodiment of a bonding assembly having a slider scale package of a slider/MR head and a flex circuit for electrically connecting the slider/MR head to a head interconnect circuit in an HGA in accordance with the principles of the present invention.

FIG. 7 illustrates an alternative, second embodiment of a bonding assembly 152 having a slider scale package 154 of a slider/MR head 156 and a flex circuit 158 for electrically connecting the slider/MR head 156 to the head interconnect circuit 130 on the suspension 124.

In FIG. 7, the flex circuit 158 includes a conductive material 160, preferably copper. One end of the conductive material 148 is bent upwardly and electrically connected and bonded to a bond pad 162 of the slider/MR head 142. The bond pad 162 is disposed at the back of the slider/MR head 156, as opposed to at the front end of the slider/MR head 142 as shown in FIG. 3. Similarly, the bonding can be done by a variety of ways, such as solder, conductive adhesive, etc. The flex circuit 158 also includes an interconnect pad 164 disposed at the other end of the conductive material 160. As shown, the interconnect pad 164 is positioned at the back of the slider/MR head 156 and is electrically bonded to the conductive material 134 of the head interconnect circuit 130. Similarly, the bonding of the interconnect pad 164 to the conductive material 134 of the circuit 130 can be done by a variety of ways, such as solder, conductive adhesive, thermo-compression gold to gold, conductive polymers, etc.

Figure 8:
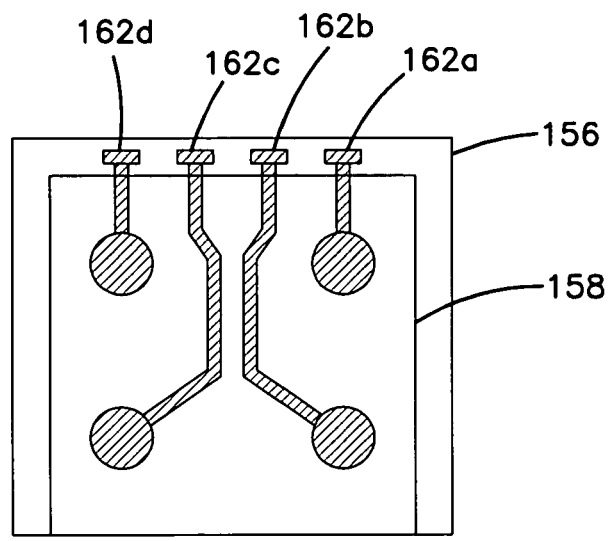
FIG. 8 illustrates one embodiment of interconnect pads disposed at the back of the slider scale package of the slider/MR head and the flex circuit of the second embodiment of the bonding assembly in accordance with the principles of the present invention.
Figure 9:
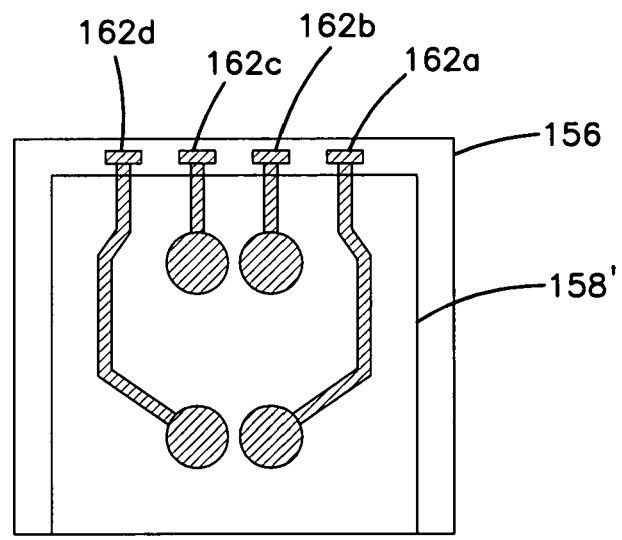
FIG. 9 illustrates an alternative embodiment of interconnect pads disposed at the back of the slider scale package of the slider/MR head and the flex circuit of the second embodiment of the bonding assembly in accordance with the principles of the present invention.

Similar to FIGS. 4–5, FIGS. 8–9 illustrate two different embodiments of interconnect pads 162 for reverse polarity of the head interconnect circuit 130. The interconnect pads are disposed at the back of the package of the slider/MR head 156 and the flex circuit 158, 158' in accordance with the principles of the present invention. Except that the bond pads 162a–d are disposed at the back of the slider/MR head 156, other features in FIGS. 8–9 are generally the same as those shown in FIGS. 4–5.

Figure 10:
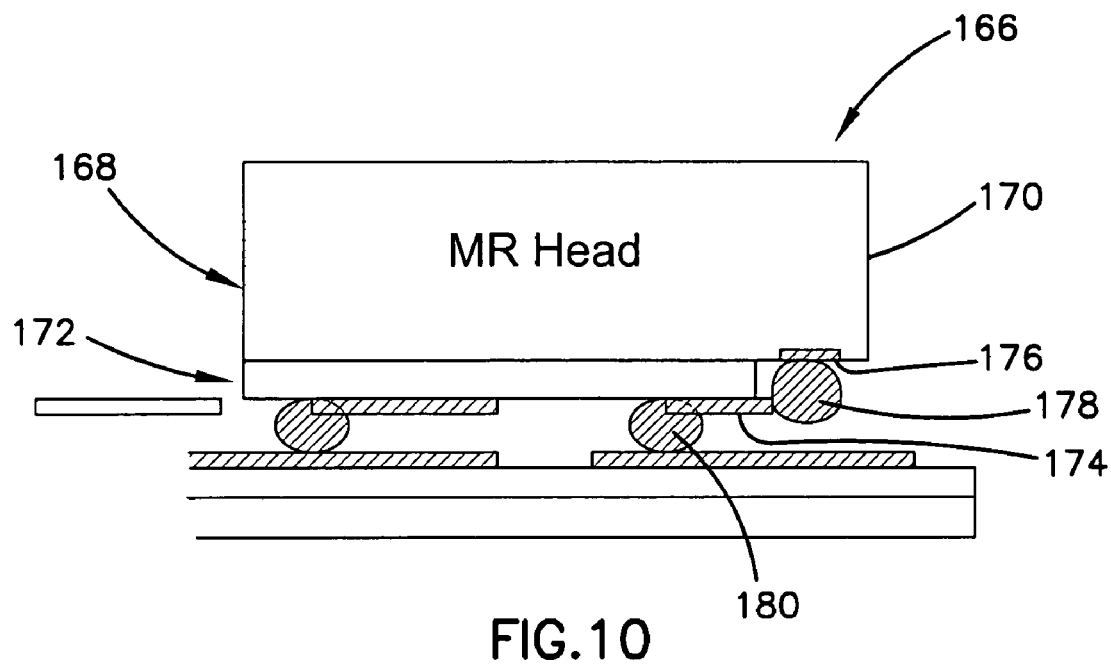
FIG. 10 illustrates a cross-sectional view of a third embodiment of a bonding assembly having a slider scale package of a slider/MR head and a flex circuit for electrically connecting the slider/MR head to a head interconnect circuit in an HGA in accordance with the principles of the present invention.
Figure 11:
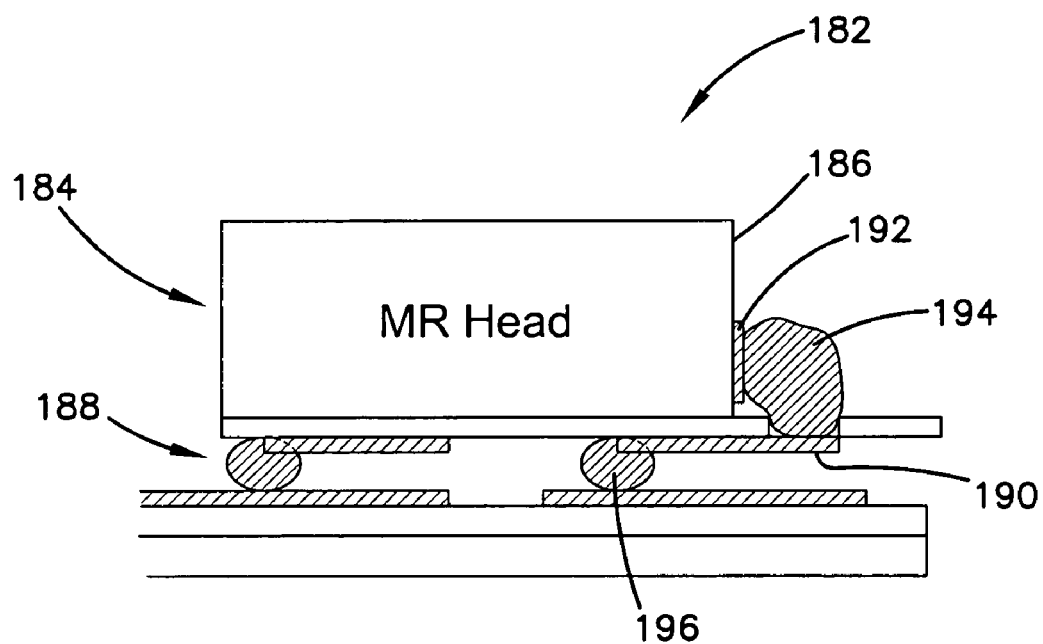
FIG. 11 illustrates a cross-sectional view of a fourth embodiment of a bonding assembly having a slider scale package of a slider/MR head and a flex circuit for electrically connecting the slider/MR head to a head interconnect circuit in an HGA in accordance with the principles of the present invention.

It is appreciated that the above slider scale package technique in accordance with the principles of the present invention may be used in conjunction with a corner ball bonding technique, as shown in FIGS. 10 and 11.

FIG. 10 illustrates an alternative, third embodiment of a bonding assembly 166 having a slider scale package 168 of a slider/MR head 170 and a flex circuit 172 for electrically connecting the slider/MR head 170 to the head interconnect circuit 130 on the suspension 124.

In FIG. 10, the flex circuit 172 includes a conductive material 174, preferably copper. One end of the conductive material 174 is electrically connected and bonded to a bond pad 176 of the slider/MR head 170 via a bonding ball 178. The bond pad 176 is disposed at the back of the slider/MR head 170. Similarly, the bonding can be done by a variety of ways, such as solder, conductive adhesive, etc. The flex circuit 172 also includes an interconnect pad 180 disposed at the other end of the conductive material 174. As shown, the interconnect pad 180 is positioned at the back of the slider/MR head 170 and is electrically bonded to the conductive material 134 of the head interconnect circuit 130. Similarly, the bonding of the interconnect pad 180 to the conductive material 134 of the circuit 130 can be done by a variety of ways, such as solder, conductive adhesive, thermo-compression gold to gold, conductive polymers, etc.

FIG. 11 illustrates an alternative, fourth embodiment of a bonding assembly 182 having a slider scale package 184 of a slider/MR head 186 and a flex circuit 188 for electrically connecting the slider/MR head 186 to the head interconnect circuit 130 on the suspension 124.

In FIG. 11, the flex circuit 188 includes a conductive material 190, preferably copper. One end of the conductive material 190 is electrically connected and bonded to a bond pad 192 of the slider/MR head 186 via a bonding ball 194. The bond pad 192 is disposed at the front end of the slider/MR head 186, as opposed to at the back end of the slider/MR head 186. Similarly, the bonding can be done by a variety of ways, such as solder, conductive adhesive, etc. The flex circuit 188 also includes an interconnect pad 196 disposed at the other end of the conductive material 190. As shown, the interconnect pad 196 is positioned at the back of the slider/MR head 186 and is electrically bonded to the conductive material 134 of the head interconnect circuit 130. Similarly, the bonding of the interconnect pad 196 to the conductive material 134 of the circuit 130 can be done by a variety of ways, such as solder, conductive adhesive, thermo-compression gold to gold, conductive polymers, etc.

It is appreciated that in addition to a conductive material, the flex circuit 144, 144' 158, 158' 172, and 188 also includes a dielectric material, for example, polyimide. The conductive material can be patterned on the dielectric material and/or laminated into a single sheet lamination, preferably covered by an insulating cover (not shown).

It is to be understood that even though numerous characteristics and advantages of various embodiments of the present invention have been set forth in the foregoing description, together with details of the structure and function of various embodiments of the invention. This disclosure is illustrative only, and changes may be made in detail within the principles of the present invention to the full extent indicated by the broad general meaning of the terms in which the appended claims are expressed.

What is claimed is:

1. A head gimbal assembly comprising:
   a suspension;
   a head interconnect circuit being attached to and disposed along the suspension, the head interconnect circuit including a first conductive material; and a slider comprising a top and a bottom; and
   a flex circuit having a first and second surface, wherein the first surface is opposite the second surface, further wherein the first surface is attached to the top of the slider, and at least one interconnect pad is disposed on the second surface of the flex circuit in an area between the slider and the suspension for providing electrical contact with the conductive material of the head interconnect circuit.

2. The head gimbal assembly of claim 1, wherein the slider includes a front end and at least one bond pad disposed on the front end, and the flex circuit further includes a second conductive material extending between the at least one bond pad and the at least one interconnect pad, and the conductive material of the flex circuit is electrically connected to the at least one interconnect pad and to the at least one bond pad.

3. The head gimbal assembly of claim 2, wherein the flex circuit includes first, second, third, and fourth interconnect pads disposed on the second surface of the flex circuit, and the slider includes first, second, third, and fourth bond pads disposed on the front end of the slider, wherein the at least one interconnect pad is one of the first, second, third or fourth interconnect pads, and the at least one bond pad is one of the first, second, third or fourth bond pads.

4. The head gimbal assembly of claim 3, wherein the first and second bond pads are electrically coupled to a first pair of positive and negative polarities of the slider for reading data, respectively, and the third and fourth bond pads are electrically coupled to a second pair of positive and negative polarities of the slider for writing data, respectively, and the first, second, third, and fourth interconnect pads are arranged such that polarities of the bond pads match with polarities from the interconnect pads.

5. A head gimbal assembly comprising:
   a suspension, the suspension having a plurality of first conductive material;
   a slider having a top and a bottom;
   a polymer flex circuit having a first and second surface, wherein the first surface is positioned on the top of the slider and the second surface is positioned opposite of the first surface, further wherein the polymer flex circuit has a plurality of second conductive material positioned on the second surface; and
   at least one interconnect pad disposed between the plurality of first conductive material and the plurality of second conductive material to establish an electrical connection.

6. The head gimbal assembly of claim 5, wherein the slider further includes at least one bond pad wherein the bond pad provides for an electrical connection to a transducer positioned in the slider.

7. The head gimbal assembly of claim 6, wherein said plurality of second conductive material extends and is electrically connected to said bond pad.

8. The head gimbal assembly of claim 6, wherein the slider further includes a front end, further wherein said bond pad is positioned on said front end.

9. The head gimbal assembly of claim 6, wherein the flex circuit includes first, second, third, and fourth interconnect pads disposed on the second surface of the flex circuit, and the slider includes first, second, third, and fourth bond pads disposed on the front end of the slider, wherein the at least one interconnect pad is one of the first, second, third or fourth interconnect pads, and the at least one bond pad is one of the first, second, third or fourth bond pads.

10. The head gimbal assembly of claim 9, wherein the first and second bond pads are electrically coupled to a first pair of positive and negative polarities of the slider for reading data, respectively, and the third and fourth bond pads are electrically coupled to a second pair of positive and negative polarities of the slider for writing data, respectively.

11. The head gimbal assembly of claim 10, wherein the first, second, third, and fourth interconnect pads are arranged such that polarities of the bond pads match with polarities of the interconnect pads.

12. The head gimbal assembly of claim 11, wherein the first and second interconnect pads are electrically connected to the first and second bond pads of the slider, respectively, and the third and fourth interconnect pads are electrically connected to the third and fourth bond pads of the slider, respectively.

* * * * *